(12) United States Patent
Onat

(10) Patent No.: US 8,247,754 B2
(45) Date of Patent: Aug. 21, 2012

(54) SOLID STATE FOCAL PLANE ARRAY FOR HYPERSPECTRAL IMAGING APPLICATIONS

(75) Inventor: Bora Muammer Onat, Princeton, NJ (US)

(73) Assignee: Princeton Lightwave, Inc., Cranbury, NJ (US)

( * ) Notice: Subject to any disclaimer, the term of this patent is extended or adjusted under 35 U.S.C. 154(b) by 350 days.

(21) Appl. No.: 12/408,243

(22) Filed: Mar. 20, 2009

(65) Prior Publication Data

US 2009/0256059 A1    Oct. 15, 2009

Related U.S. Application Data

(60) Provisional application No. 61/043,627, filed on Apr. 9, 2008.

(51) Int. Cl.
*H01L 27/142* (2006.01)
(52) U.S. Cl. .................................. 250/208.1; 250/226
(58) Field of Classification Search ............ 250/339.01, 250/339.02, 349, 370.06, 208.1, 226
See application file for complete search history.

(56) References Cited

U.S. PATENT DOCUMENTS

| | | | | |
|---|---|---|---|---|
| 4,699,273 A | * | 10/1987 | Suggi-Liverani et al. | 209/580 |
| 5,315,128 A | * | 5/1994 | Hunt et al. | 257/16 |
| 6,013,912 A | * | 1/2000 | Pautrat et al. | 250/226 |
| 7,135,698 B2 | * | 11/2006 | Mitra | 257/21 |

OTHER PUBLICATIONS

M. Selim Unlu, "Resonant cavity enhanced photonic devices", "Journal of Applied Physics", Jul. 15, 1995, pp. 607-640, vol. 78, No. 2, Publisher: American Institute of Physics, Published in: US.
Klunder, Greg, "Standoff Detection of High Explosives with Near Infrared Spectroscopy", "FACSS, Sep. 2006", 2006, Publisher: Lawrence Livermore National Laboratory Forensic Science Center, Published in: US.

* cited by examiner

*Primary Examiner* — Tony Ko
(74) *Attorney, Agent, or Firm* — Kaplan Breyer Schwarz & Ottesen LLP

(57) ABSTRACT

A focal plane array suitable for use in hyperspectral imaging applications is provided. The focal plane array comprises pixels comprising arrays of photodiodes, wherein each photodiode in each array is selectively sensitive to a different wavelength of a set of wavelengths.

20 Claims, 2 Drawing Sheets

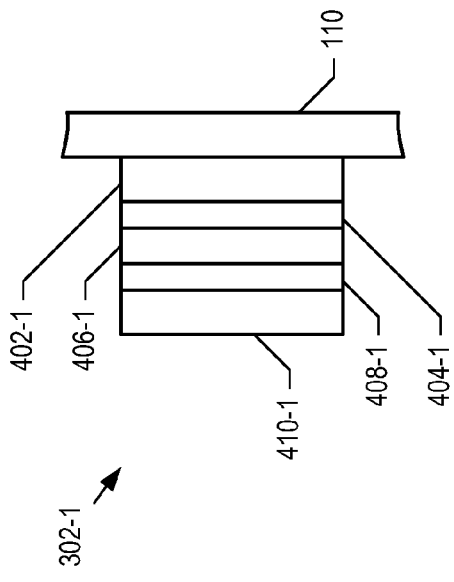

SOLID STATE FOCAL PLANE ARRAY FOR HYPERSPECTRAL IMAGING APPLICATIONS

CROSS-REFERENCE TO RELATED APPLICATION

This application claims the benefit of U.S. provisional application Ser. No. 61/043,627, filed 9 Apr. 2008, entitled "Solid state focal plane array for hyperspectral imaging applications," which is incorporated by reference.

FIELD OF THE INVENTION

The present invention relates to spectroscopy in general, and, more particularly, to hyperspectral imaging.

BACKGROUND OF THE INVENTION

Spectroscopy can be used to identify a material through analysis of its spectral signature. Energetic materials are particularly amenable to such identification. Currently available techniques for materials identification, however, are limited by the need to provide elements such as scanners or diffraction gratings that complicate the overall system. In addition, conventional systems require post-processing for image reconstruction. As a result, the mechanical setup used for a scanning process can make conventional systems bulky, complicated, susceptible to noise from environmental vibrations and shock, and overly expensive.

SUMMARY OF THE INVENTION

The present invention enables materials identification by analysis of the material's spectral signature in a way that avoids some of the expense and problems of the prior art. Specifically, the present invention utilizes hyperspectral imaging at frame rates comparable to conventional video frame rates. Embodiments of the present invention are particularly useful for applications such as hyperspectral imaging and spectroscopy. In some embodiments, spectral information is provided by the present invention on a pixel-by-pixel basis.

In some embodiments, the present invention comprises a photodiode array, wherein at least one of the photodiodes is configured as a resonant cavity enhanced photodetector. In some embodiments, the photodiode array is disposed on a readout integrated circuit. In some embodiments, one or more of the photodiodes in an array comprise a semiconductor or dielectric distributed Bragg reflector, as well as a second reflector, that are interposed by an absorption region. In some embodiments, each photodiode in an array is individually tuned to be selectively sensitive to a different one of a set of wavelengths in a range of wavelengths. In some embodiments, each photodiode in an array of photodiodes is tuned to a different wavelength in a range of wavelengths during fabrication. These photodiodes are tuned by recessing a surface of a cap layer that is included in the photodiode structure.

In some embodiments, a plurality of arrays of individually tuned photodiodes forms a two-dimensional focal plane array. Each photodiode in each array is tuned to a different one of a set of wavelengths of interest. Each of these of these arrays defines a pixel of the focal plane array. In this way, each pixel can provide an electrical signal that corresponds to light having each wavelength in the set of wavelengths that is received at each pixel. In some embodiments, the relative intensity of the different received wavelength signals is used to develop an estimate of a property of a material contained in the scene imaged on the focal plane array. In some embodiments, the sum of signals is used to develop an estimate of the total intensity of the received light at each pixel. In some embodiments, the sum of the signals corresponding to each individual wavelength received at all pixels is used to provide a spectral signature associated with a material in the scene imaged onto the focal plane array.

An embodiment of the present invention comprises: a substrate; a first photodiode array disposed on the substrate, wherein the first photodiode array comprises a first photodiode for providing a first electrical signal, wherein the first photodiode comprises a first physical adaptation that enables it to selectively detect light having a first wavelength within a spectral range and a second photodiode for providing a second electrical signal, wherein the second photodiode comprises a second physical adaptation that enables it to selectively detect light having a second wavelength within the spectral range.

BRIEF DESCRIPTION OF THE DRAWINGS

FIG. 2 depicts a schematic diagram of focal plane array 108 in accordance with the illustrative embodiment of the present invention.

FIG. 3 depicts a schematic diagram of a pixel of a focal plane array in accordance with the illustrative embodiment of the present invention.

FIG. 4 depicts a schematic of details of a photodiode in accordance with the illustrative embodiment of the present invention.

DETAILED DESCRIPTION

Figure 1:
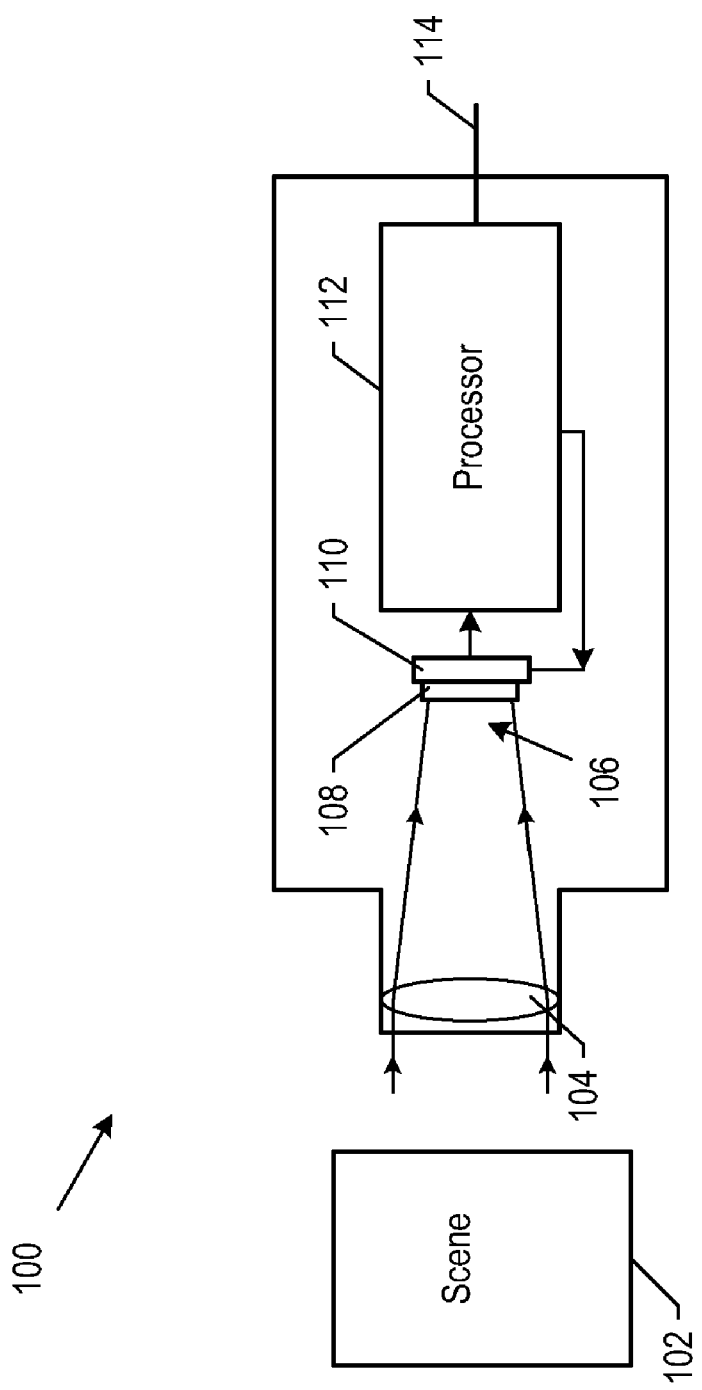
FIG. 1 depicts a schematic diagram of a portion of a spectrometer in accordance with an illustrative embodiment of the present invention.

FIG. 1 depicts a schematic diagram of a portion of a spectrometer in accordance with an illustrative embodiment of the present invention. Spectrometer 100 comprises lens 104, focal plane array 108, read-out integrated circuit 110, and processor 112.

Lens 104 is a lens suitable for imaging scene 102 onto focal plane array 108. The illustrative embodiment is designed to operate in the near-infrared wavelength region; therefore, lens 104 comprises a material suitable for use at these wavelengths.

Focal plane array 108 is an array of photodiodes sensitive to wavelengths in the near-infrared wavelength region—specifically in the 1280 through 1600 nanometer wavelength range. Although the illustrative embodiment comprises photodiodes that operate in the near-infrared region, it will be clear to one of ordinary skill in the art, after reading this specification, how to make and use alternative embodiments of the present invention wherein focal plane array 108 comprises photodiodes that operate at wavelengths in any wavelength range.

Read-out integrated circuit 110 (hereinafter, ROIC 110) is a conventional ROIC used to read-out electrical signals from a focal plane array.

Processor 112 is a processor for receiving electrical signals from focal plane array 108 and generating output signal 114. Processor 112 is enabled to generate an output signal that corresponds to:

i. a difference between the responses of photodiodes that are sensitive to different wavelengths; or ii. a sum of the responses of photodiodes that are sensitive to the same wavelength; or iii. a sum of responses of photodiodes that are sensitive to different wavelengths; or iv. relative variations in the responses of photodiodes that are sensitive to different wavelengths; or v. an estimate of a material contained in scene 102 based on a spectral signature developed from signals provided by focal plane array 108; or vi. spectroscopic information about scene 102 based on signals provided by focal plane array 108; or vii. any combination of i, ii, iii, iv, v, and vi.

FIG. 2 depicts a schematic diagram of focal plane array 108 in accordance with the illustrative embodiment of the present invention. Focal plane array 108 comprises photodiode 202-1 and 202-2, which are disposed on ROIC 110. ROIC 110 provides a substrate for supporting focal plane array 108. In some embodiments, focal plane array 108 is bonded to ROIC 110 using hybrid integration techniques. In some embodiments, focal plane array 108 is grown directly on ROIC 110 using epitaxial growth or hetero-epitaxial growth techniques.

Photodiode array 202-1 is a first set of photodiodes, each of which is selectively sensitive to a different wavelength within a set of wavelengths that collectively define a spectral range. Photodiode array 202-1 defines a first pixel of focal plane array 108.

Photodiode array 202-2 is a second set of photodiodes, each of which is selectively sensitive to a different wavelength within the set of wavelengths. Each photodiode in photodiode array 202-2 corresponds to a photodiode in photodiode array 202-1 that is sensitive to the same wavelength. Photodiode array 202-2 defines a second pixel of focal plane array 108.

Although the illustrative embodiment depicts a focal plane array containing only two pixels, it will be clear to one skilled in the art, after reading this specification, how to make and use alternative embodiments of the present invention wherein a focal plane array comprises any number of pixels, and wherein the pixels are arranged in one dimension or two dimensions. It will also be clear how to make and use alternative embodiments wherein a first photodiode array has photodiodes that are selectively sensitive to different wavelengths that the photodiodes of a second array.

FIG. 3 depicts a schematic diagram of a pixel of a focal plane array in accordance with the illustrative embodiment of the present invention. Photodiode array 202-1 comprises photodiodes 302-1 through 302-4. Each of photodiodes 302-1 through 302-4 is selectively sensitive to a different wavelength contained in the set of wavelengths. Collectively, photodiodes 302-1 through 302-4 enable photodiode array 202-1 to provide a complete spectral signature for the light that is incident on this pixel.

The selectivity of each photodiode in photodiode array 202-1 is derived by employing a resonant cavity enhanced photodetection structure into the photodiode, as is explained below and with respect to FIG. 4.

FIG. 4 depicts a schematic of details of a photodiode in accordance with the illustrative embodiment of the present invention. Photodiode 302-1 is disposed on ROIC 110 and comprises a first reflector 402-1, contact layer 404-1, absorption layer 406-2, a second reflector of distributed Bragg type 408-1, and substrate 410-1. Photodiode 302-1 is an avalanche photodiode that has sensitivity to a wavelength within the 1280 to 1600 nanometer wavelength range. Although the illustrative embodiment comprises a photodiode that is an avalanche photodiode, it will be clear to one skilled in the art, after reading this specification, how to make and use alternative embodiments of the present invention that comprise a photodiode that is other than an avalanche photodiode.

The structure of photodiode 302-1 comprises conventional avalanche photodiode layers such as contact layer 404-1, absorption layer 406-2. These are InP-based material layers that are grown on InP photodiode substrate layer 410-1 in conventional fashion to achieve avalanche photodiode behavior.

The wavelength selectivity of photodiode 302-1 is enabled by forming the avalanche photodiode layer structure within an optically resonant cavity. This optically resonant cavity is defined by distributed Bragg reflector 408-1 and first reflector 402-1. By virtue of its placement within this optically resonant cavity, the avalanche photodiode structure of photodiode 302-1 is afforded wavelength selectivity and enhanced responsivity. The optically resonant cavity rejects those wavelengths for which it is not resonant, while increasing the optical field between the reflectors for wavelengths at which it is resonant.

Resonant cavity enhanced photodetection methods are described in "Resonant Cavity Enhanced Photonic Devices," by M. S. Unlu, in the Journal of Applied Physics, Vol. 78(2), July 1995, pp. 607-639.

Distributed Bragg reflector 408-1 comprises a plurality of semiconductor layers, which collectively act as a multi-layer mirror stack. In some embodiments, the layers are a series of semiconductor layers, each of which has a thickness equal to ¼ of the wavelength of interest (within the material layer itself). In some embodiments, the multilayer mirror stack comprises dielectric layers that are deposited after substrate 410-1 has been removed using conventional semiconductor processing techniques. In some embodiments, distributed Bragg reflector 408-1 comprises a plurality of dielectric layers. In some embodiments, distributed Bragg reflector 408-1 comprises a plurality of layers that include semiconductor layers and dielectric layers.

Reflector 402-1 is a layer of metal that has a thickness appropriate for providing reflectivity at the wavelength of interest.

Specific wavelength selectivity for photodiode 302-1 is enabled by forming the photodiode structure with surface recessing of layer 404-1 to change the separation between reflector 408-1 and reflector 402-1, thereby "tuning" the optical resonance of the optically resonant cavity. In some embodiments, the optically resonant cavity has a resonance that defines a free-spectral range and the set of wavelengths for which photodiode array 202-1 is sensitive comprises one free-spectral range of the resonant cavity.

It is to be understood that the disclosure teaches just one example of the illustrative embodiment and that many variations of the invention can easily be devised by those skilled in the art after reading this disclosure and that the scope of the present invention is to be determined by the following claims.

What is claimed is:

1. An apparatus comprising:
   a substrate;
   a first pixel comprising a first photodiode array disposed on the substrate, wherein the first photodiode array comprises;
   a first photodiode for providing a first electrical signal, the first photodiode comprising a first reflector and a second reflector that are separated by a first separation, wherein the first reflector and the second reflector collectively define a first optically resonant cavity that is selectively resonant for a first wavelength within a spectral range, and wherein the first wavelength is based on the first separation; and a second photodiode for providing a second electrical signal, the second photodiode comprising a third reflector and a fourth reflector that are separated by a second separation that is different from the first separation, wherein the third reflector and the fourth reflector collectively define a second optically resonant cavity that is selectively resonant for a second wavelength within the spectral range, and wherein the second wavelength is based on the second separation.

2. The apparatus of claim 1 further comprising a processor, wherein the processor receives the first electrical signal and the second electrical signal and provides a property of a material based on the first electrical signal and the second electrical signal.

3. The apparatus of claim 1 wherein the first optically resonant cavity comprises a Bragg reflector.

4. The apparatus of claim 1 further comprising a second pixel comprising a second photodiode array disposed on the substrate, wherein the second photodiode array comprises:
  a third photodiode for providing a third electrical signal, the third photodiode comprising a fifth reflector and a sixth reflector that are separated by the first separation, wherein the fifth reflector and the sixth reflector collectively define a third optically resonant cavity that is selectively resonant for the first wavelength; and
  a fourth photodiode for providing a fourth electrical signal, the fourth photodiode comprising a seventh reflector and an eighth reflector that are separated by the second separation, wherein the seventh reflector and an eighth reflector collectively define a fourth optically resonant cavity that is selectively resonant for the second wavelength.

5. The apparatus of claim 4 further comprising a processor, wherein the processor receives the first electrical signal, second electrical signal, third electrical signal, and fourth electrical signal, and wherein the processor provides a fifth electrical signal based on the first electrical signal and the second electrical signal, and further wherein the processor provides a sixth electrical signal based on a sum of the first and third electrical signals and a sum of the second and fourth electrical signals.

6. An apparatus comprising:
  (1) a substrate;
  (2) a focal plane array disposed on the substrate, wherein the focal plane array comprises;
    (i) a first pixel comprising a first plurality of photodiodes, wherein each of the first plurality of photodiodes comprises a bottom reflector that is proximal to the substrate and a top reflector that is distal to the substrate, the bottom reflector and top reflector collectively defining an optically resonant cavity having a cavity length, wherein the cavity length of each of the first plurality of photodiodes is different such that each optically resonant cavity of the first plurality of photodiodes is selectively resonant for a different wavelength of a set of wavelengths, and wherein the first plurality of photodiodes collectively detects all of the wavelengths in the set of wavelengths; and
    (ii) a second pixel comprising a second plurality of photodiodes, wherein each of the second plurality of photodiodes comprises a bottom reflector that is proximal to the substrate and a top reflector that is distal to the substrate, the bottom reflector and top reflector collectively defining an optically resonant cavity having a cavity length, wherein the cavity length of each of the second plurality of photodiodes is different such that each optically resonant cavity of the second plurality of photodiodes is selectively resonant for a different wavelength of the set of wavelengths, and wherein the second plurality of photodiodes collectively detects all of the wavelengths in the set of wavelengths; and
  (3) a processor, wherein the processor receives a first plurality of electrical signals from the first plurality of photodiodes, and wherein the processor receives a second plurality of electrical signals from the second plurality of photodiodes.

7. The apparatus of claim 6 wherein the processor correlates the first plurality of electrical signals and the second plurality of electrical signals and provides an output signal based on the correlated electrical signals.

8. The apparatus of claim 6 wherein the first plurality of photodiodes comprises a first photodiode that is selectively sensitive to a first wavelength that is a member of the set of wavelengths, and wherein the second plurality of photodiodes comprises a second photodiode that is selectively sensitive to the first wavelength, and further wherein the processor provides an output signal based on each of the response of the first photodiode and response of the second photodiode.

9. An apparatus comprising a focal plane array, wherein the focal plane array is disposed on a substrate, and wherein the focal plane array comprises:
  a first pixel comprising a first plurality of photodiodes, wherein each of the first plurality of photodiodes comprises a bottom reflector and a top reflector that is a semiconductor distributed Bragg reflector, the bottom reflector and top reflector collectively defining an optically resonant cavity that is selectively resonant for a different wavelength of a first plurality of wavelengths; and
  a second pixel comprising a second plurality of photodiodes, wherein each of the second plurality of photodiodes comprises a bottom reflector and a top reflector that is a semiconductor distributed Bragg reflector, the bottom reflector and top reflector collectively defining an optically resonant cavity that is selectively resonant for a different wavelength of the first plurality of wavelengths.

10. The apparatus of claim 9 further comprising an imager for providing an image of a scene to the focal plane array.

11. The apparatus of claim 9 further comprising a processor, wherein the processor is electrically coupled to each of the first plurality of photodiodes and the second plurality of photodiodes.

12. The apparatus of claim 9 further comprising:
  an imager for providing an image of an scene to the focal plane array; and
  a processor, wherein the processor receives an electrical signal from each of the first plurality of photodiodes and the second plurality of photodiodes, and wherein the processor provides a output based on the received electrical signals.

13. A method comprising:
  providing an image of a scene to a focal plane array, wherein the focal plane array comprises a first pixel comprising a first plurality of photodiodes, and wherein each of the first plurality of photodiodes comprises a bottom reflector and a top reflector that collectively define an optically resonant cavity having a resonance based on the bottom reflector and the top reflector, and further wherein each of the first plurality of photodiodes is selectively resonant for a different wavelength of a set of wavelengths;

providing an electrical signal from each of the first plurality of photodiodes to a processor; and generating an output based on the electrical signals from the first plurality of photodiodes, wherein the processor generates the output.

14. The method of claim 13 wherein the processor generates the output based on the relative values of the electrical signals received from the first plurality of photodiodes.

15. The method of claim 13 wherein the processor generates the output based on the sum of values of the electrical signals received from the first plurality of photodiodes.

16. The method of claim 13 wherein the scene comprises a material, and wherein the output is based on a property of the material.

17. A method comprising:

providing a first pixel disposed on a substrate, the first pixel comprising a first photodiode and a second photodiode, wherein the first photodiode comprises a first reflector that is proximal to the substrate and a second reflector that is distal to the substrate, the first reflector and second reflector collectively defining a first optically resonant cavity that is selectively resonant for a first wavelength within a free- spectral range, the resonance of the first optically resonant cavity being determined by the separation between the first reflector and the second reflector, and wherein the second photodiode comprises a third reflector that is proximal to the substrate and a fourth reflector that is distal to the substrate, the third reflector and fourth reflector collectively defining a second optically resonant cavity that is selectively resonant for a second wavelength within the free-spectral range, the resonance of the second optically resonant cavity being determined by the separation between the third reflector and the fourth reflector, and further wherein the absorption region of the first photodiode is within the first optically resonant cavity and the absorption region of the second photodiode is within the second optically resonant cavity;

imaging an object onto the substrate;

generating a first electrical signal based on light having the first wavelength received at the first photodiode; and generating a second electrical signal based on light having the second wavelength received at the second photodiode.

18. The method of claim 17 further comprising generating an output signal based on the first electrical signal and the second electrical signal.

19. The method of claim 17 further comprising generating an output signal based on a difference between the first electrical signal and the second electrical signal.

20. The method of claim 17 further comprising providing a second pixel disposed on the substrate, the second pixel comprising a third photodiode and a fourth photodiode, wherein the third photodiode comprises a fifth reflector that is proximal to the substrate and a sixth reflector that is distal to the substrate, the fifth reflector and sixth reflector collectively defining a third optically resonant cavity that is selectively resonant for the first wavelength, the resonance of the third optically resonant cavity being determined by the separation between the fifth reflector and the sixth reflector, and wherein the fourth photodiode comprises a seventh reflector that is proximal to the substrate and an eighth reflector that is distal to the substrate, the seventh reflector and eighth reflector collectively defining a fourth optically resonant cavity that is selectively resonant for the second wavelength, the resonance of the fourth optically resonant cavity being determined by the separation between the seventh reflector and the eighth reflector, and further wherein the absorption region of the third photodiode is within the third optically resonant cavity and the absorption region of the fourth photodiode is within the fourth optically resonant cavity;

generating a third electrical signal based on light having the first wavelength received at the third photodiode; and generating a first electrical signal based on light having the second wavelength received at the fourth photodiode.

* * * * *